United States Patent
Hunt et al.

(10) Patent No.: US 6,608,758 B1
(45) Date of Patent: Aug. 19, 2003

(54) CHASSIS SHIELDING SYSTEM

(75) Inventors: Daniel Joseph Hunt, Cary, NC (US); Edward N. Dials, Apex, NC (US); Joseph Francis Xavier Doman, Raleigh, NC (US); William Drummond Owsley, Durham, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/657,865

(22) Filed: Sep. 7, 2000

(51) Int. Cl.[7] .............. H05K 5/03; H05K 7/14; H05K 9/00
(52) U.S. Cl. .......... 361/753; 361/752; 361/800; 361/816; 361/818; 174/35 GC; 174/35 R; 174/35 C
(58) Field of Search .......... 174/35 GC, 35 C, 174/35 R; 361/752, 753, 759, 800, 801, 802, 816, 818, 825, 796, 799, 743, 413, 424

(56) References Cited

U.S. PATENT DOCUMENTS

| | | | |
|---|---|---|---|
| 5,532,428 A | * 7/1996 | Radloff | 174/35 GC |
| 5,679,923 A | * 10/1997 | Le | 174/35 R |
| 5,825,634 A | 10/1998 | Moorehead, Jr. | |
| 5,856,632 A | 1/1999 | Bostrom et al. | |
| 5,895,884 A | * 4/1999 | Davidson | 174/35 R |
| 5,934,915 A | 8/1999 | Henningsson et al. | |
| 6,002,086 A | * 12/1999 | Yajima | 174/35 R |
| 6,349,043 B1 | * 2/2002 | Jensen | 361/818 |
| 2001/0003406 A1 | * 6/2001 | Bertolami | 312/223.1 |
| 2001/0034000 A1 | * 6/2001 | Bertolami | 312/223.1 |

* cited by examiner

*Primary Examiner*—David Martin
*Assistant Examiner*—Michael L. Lindinger
(74) *Attorney, Agent, or Firm*—Sawyer Law Group, LLP

(57) ABSTRACT

A computer chassis in accordance with the present invention is disclosed. The chassis includes a first body, a second body, and an electromagnetic shield coupled between the first body and the second body. The shield includes a plurality of dimples and a plurality of valleys for providing an electromechanical seal when the shield is placed in an interference condition. The chassis shielding system utilizes a shield with a design that is inexpensive to manufacture, is structurally sturdy, and simple to implement in an interference environment. In a preferred embodiment, the shield is provided for inserting between a circuit card mounting bracket and a computer chassis. The improved shield design incorporates special features including a plurality of dimples and a plurality of valleys, strategically located for providing improved adjacent surface contact and enhanced shielding from unwanted radiation.

13 Claims, 5 Drawing Sheets

30

CHASSIS SHIELDING SYSTEM

FIELD OF THE INVENTION

The present invention relates generally to radiation shielding, and more particularly to providing a chassis shielding system.

BACKGROUND OF THE INVENTION

Electromagnetic interference (EMI) is an electrical noise that creates a disturbance, or an undesired response in electrical circuits, equipment, or systems. Many types of commercial electronic equipment, such as computers and transmitters are a source of electromagnetic emissions. Most sources primarily produce electromagnetic (E) field emissions. Most conductive materials have low impedance and therefore reflect most of the E field waves.

Electromagnetic compatibility (EMC) is the extent to which a piece of hardware will tolerate electrical interference from other equipment, in other words, the ability of a device or system to function without error in its intended electromagnetic environment. Potential sources of electromagnetic compatibility problems include radio transmitters, power lines, electronic circuits, electric motors, and just about anything that utilizes or can detect electromagnetic energy.

Electronic circuits, equipment, and systems which are sensitive to electromagnetic radiation must be shielded from sources in order to ensure proper performance. Furthermore, when equipment radiates electromagnetic radiation, the equipment must be isolated, or shielded in order to prevent degradation of the performance of surrounding equipment.

Computers are generally designed and constructed to provide for the installation of supplemental circuit cards that can be mounted in the computer in order to provide a number of different functional options. Supplemental circuit cards are typically designed and constructed with a standard mounting bracket attached to a circuit board. A typical computer has openings in the computer chassis to allow the installation of the supplemental circuit cards. However, the openings in the computer chassis increase the potential that unwanted radiation, such as electromagnetic and radio frequency emissions will have a deleterious impact upon the computer.

Shielding, which involves the use of materials to reduce radiation by reflection and/or absorption, is used in many different equipment environments, particularly those in which gaskets are required to seal seams and gaps in housings and door enclosures. Shielding is most effective when the shielding mechanism is suitably placed to cause an abrupt discontinuity in the path of radiation emissions. Additionally, shielding effectiveness and performance is a function of the properties and configuration of the shielding mechanism. Therefore, since one of the largest single sources of radiation emissions or electromagnetic leakage can occur along contact surfaces between two parts, in these situations, it is important to have a shield which is capable of establishing proper contact to ensure that a good conductive seal results.

In one conventional method, a device is designed with a multiplicity of precisely deflected "finger" for providing contact between a circuit card bracket and a computer chassis. This design is very expensive device because the tooling used to manufacture the device is quite expensive. FIG. 1 is a top view of the conventional device 100 that utilizes a multiplicity of fingers 10 in the prior art. FIG. 2 is a side view of the conventional device 100 depicting how the multiplicity of fingers 10 are precisely deflected away from the sheet 20 of the device 100. FIG. 3 is a close up cross-sectional view of the precisely deflected finger 10. As shown in FIG. 3, Finger 10 has a bi-directional formation with a portion 10 that is deflected away from the sheet 20 in one direction, and a top end 14 which bends back towards the sheet 20 in the opposite direction. Significantly, FIG. 3 also shows the conspicuous deflection 16 which occurs when the finger 10 is formed out and away from the sheet 20. FIG. 4 is a close-up cross-sectional view illustrating the desired juxtaposition of the fingers of a conventional device when interposed between a circuit card 18 and a computer chassis 19. Apparent in FIG. 2, if the deflection 16 of fingers 10 is not properly and precisely deflected away from the sheet 20, proper contact between fingers 10 and computer chassis 19 is jeopardized. Therefore, this conventional device and method suffers from a number of shortcomings since circumstances which would cause the fingers to be pushed in too far, or not be deflected out far enough from the sheet will negatively impact the effectiveness of the device.

For example, the precise deflection of the finger contactors is not obtained during manufacturing, or when the precise deflection of the fingers is distorted once the device is used, the integrity of the conventional device becomes compromised, and the efficacy of the conventional device is jeopardized. As shown, the deflected finger contactors are suspended with minimum support from the main sheet of the device. Therefore, the fingers are vulnerable to distortion once the device has been wedged between two opposing surfaces for shielding. In this conventional device, since proper contact and effective shielding is contingent upon the precise deflection of the fingers, the conventional device would be rendered ineffective if the finger deflection is distorted.

Accordingly, what is needed is a chassis shielding system which is capable of shielding unwanted emissions. The system should utilize a shield which is structurally durable, and which effectively controls unwanted radiation in an interference condition. Further, the shield should be inexpensive to manufacture, and provide proper sealing. The present invention addresses such a need.

SUMMARY OF THE INVENTION

A computer chassis in accordance with the present invention is disclosed. The chassis includes a first body, a second body, and an electromagnetic shield coupled between the first and second bodies. The shield includes a plurality of dimples and a plurality of valleys for providing an electromechanical seal when the shield is placed in an interference condition.

Accordingly, the chassis shielding system and device in accordance with the present invention is capable of controlling unwanted radiation. The shielding system in accordance with the present invention overcomes the problems of conventional shielding designs and methods by utilizing a shield which is designed with a plurality of dimples and a plurality of valleys. Therefore, the sealing effect can be enhanced and unwanted radiation can be controlled in an interference condition. The improved shield creates an inner layer between two bodies and flexes to absorb the gap between the two bodies, thus creating a seal capable of preventing EMI from escaping from a unit. The present invention describes a durable, relatively inexpensive, and effective shield which is easier to manufacture, and which may be used in varying conditions.

DETAILED DESCRIPTION

The present invention relates to a chassis shielding system which utilizes an effective, low cost shield that diminishes the impact of radiation, such as electromagnetic interference. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

The chassis shielding system in accordance with the present invention utilizes a shield which creates an inner layer between two bodies and flexes to absorb the gap between the two bodies, thus creating a seal and preventing radiation, such as EMI, from escaping from a unit. The special design utilizes dimples and shallow valleys in a thin electrically conductive membrane creating an electromechanical seal when the shield is put in an interference condition.

It should be understood that although the present invention is being described in a preferred embodiment in the context of a system which utilizes a shielding device within a computer chassis, one of ordinary skill in the art readily recognizes that the principles described herein could apply to many types of electronic equipment, and systems, and its use would be within the spirit and scope of the present invention. Specifically, the system which utilizes a shield in accordance with the present invention could be utilized in an electrostatic discharge condition (ECD), and the principals of the shielding would be within the spirit and scope of the present invention. In addition, in a preferred embodiment, the shield is utilized in conjunction with a supplemental circuit card, such as a PCI adapter card, with a standard mounting bracket attached to a circuit board, but one of ordinary skill in the art recognizes that the shield can be utilized with arrangements of another type.

Figure 1:
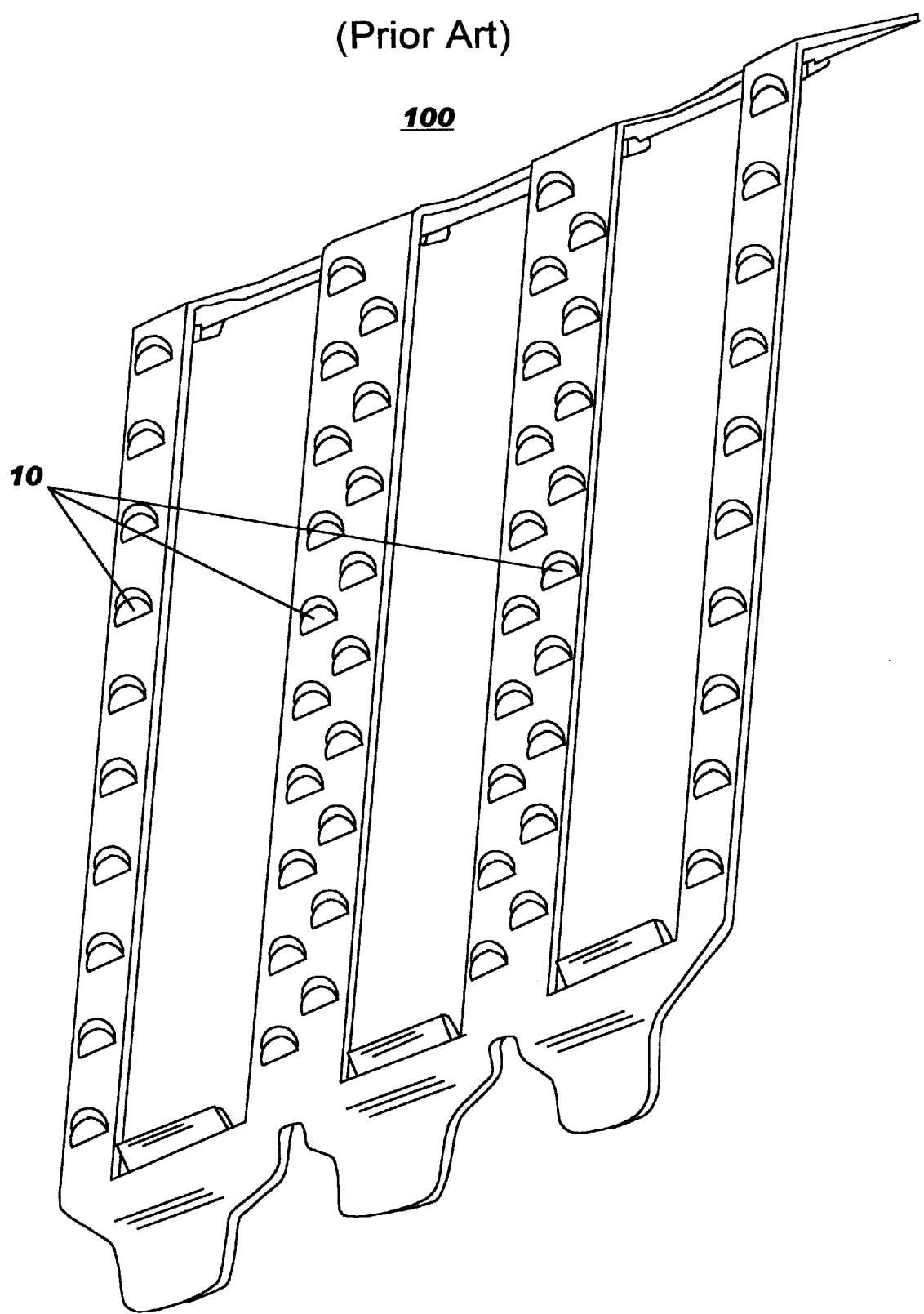
FIG. 1 is a top view illustrating a device designed with a multiplicity of fingers in the prior art.
Figure 2:
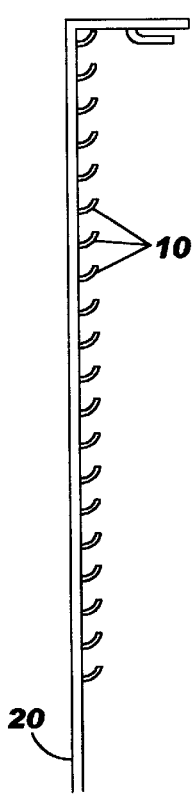
FIG. 2 is a side cross sectional view of a conventional device illustrating how the multiplicity of fingers are deflected away from the sheet in the prior art.
Figure 3:
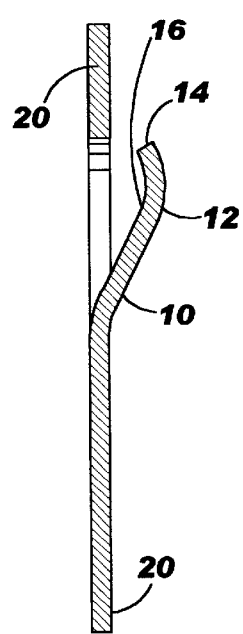
FIG. 3 is a close up cross-sectional view illustrating a precisely formed finger which is deflected away from the sheet in the prior art.
Figure 4:
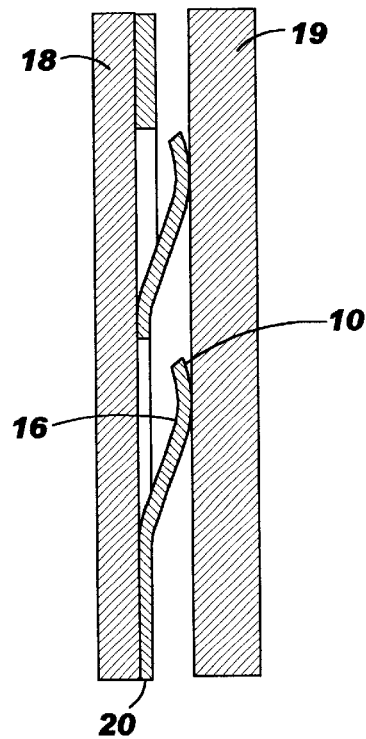
FIG. 4 is a close-up cross-sectional view illustrating the desired juxtaposition of the fingers of a conventional device when interposed between a circuit card and a computer chassis in the prior art.
Figure 5:
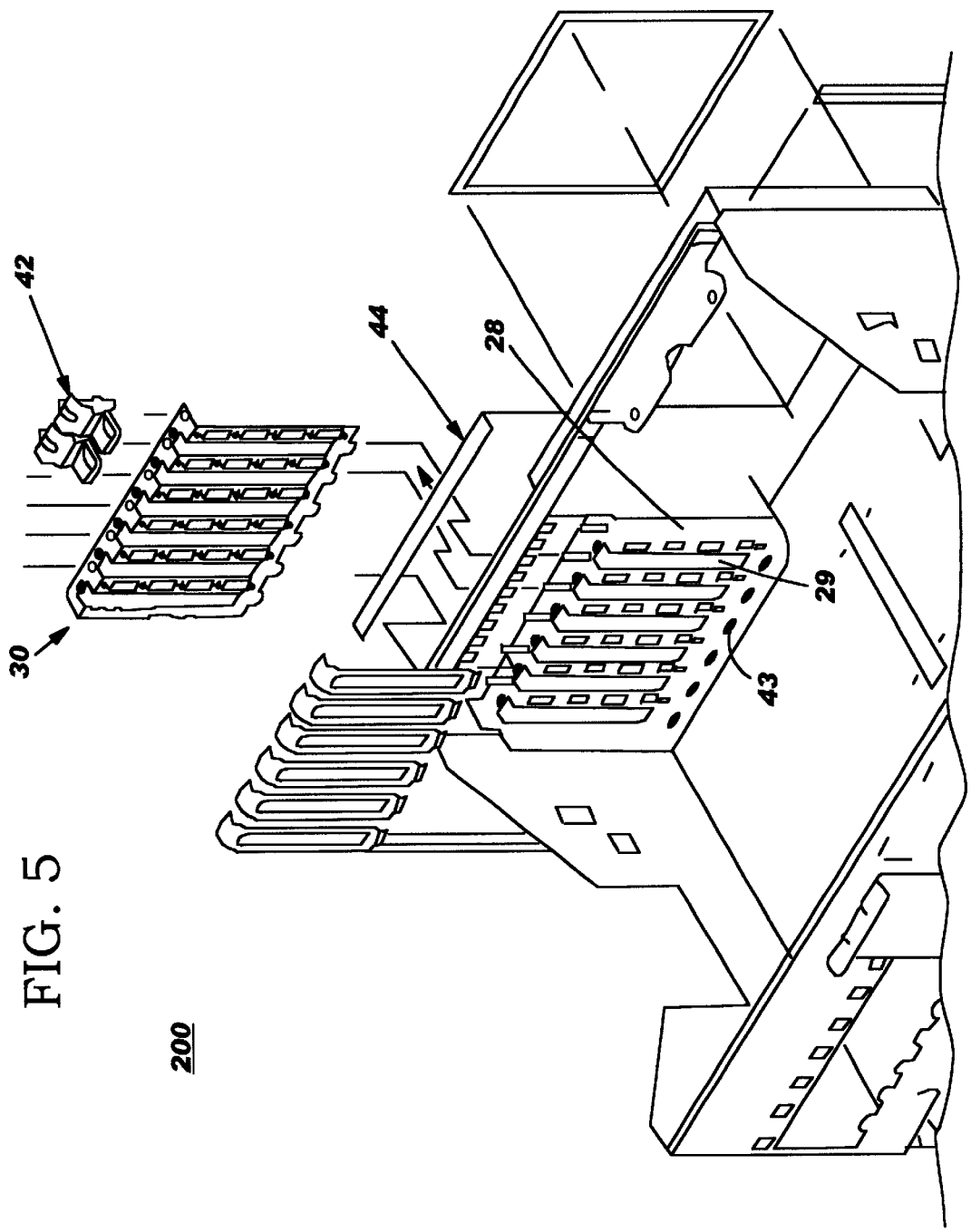
FIG. 5 is an exploded perspective view illustrating a computer chassis in accordance with the present invention.

To more particularly describe the present invention, refer now to the following description in conjunction with the accompanying figures. FIG. 5 illustrates an exploded perspective view of a chassis shielding system in a standard computer configuration in accordance with the present invention. In a preferred embodiment, a shield 30 is interposed between a computer chassis 28, and a supplemental circuit card with an attached mounting bracket, such as a PCI card (not shown) which can be added to the computer. The circuit card would be mounted in a conventional manner by juxtaposing the mounting bracket of the supplemental circuit card with a selected opening in the computer. The shield 30 creates an inner layer between the computer chassis 28 and the mounting bracket of the supplemental circuit card (not shown). The shield 30 flexes to absorb the gap between the computer chassis 28 and the supplemental circuit card with an attached mounting bracket (not shown) thus creating a seal.

Figure 6A:
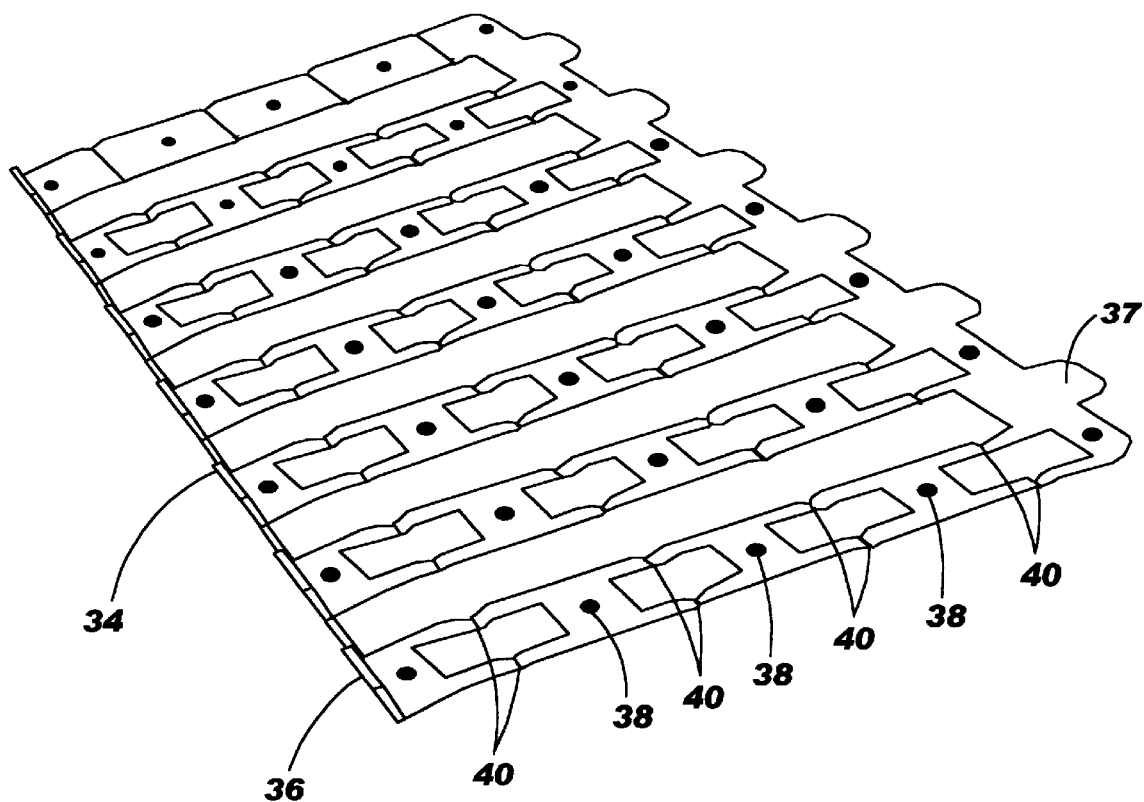
FIG. 6a illustrates a close-up top view of a shield in accordance with the present invention.
Figure 6B:
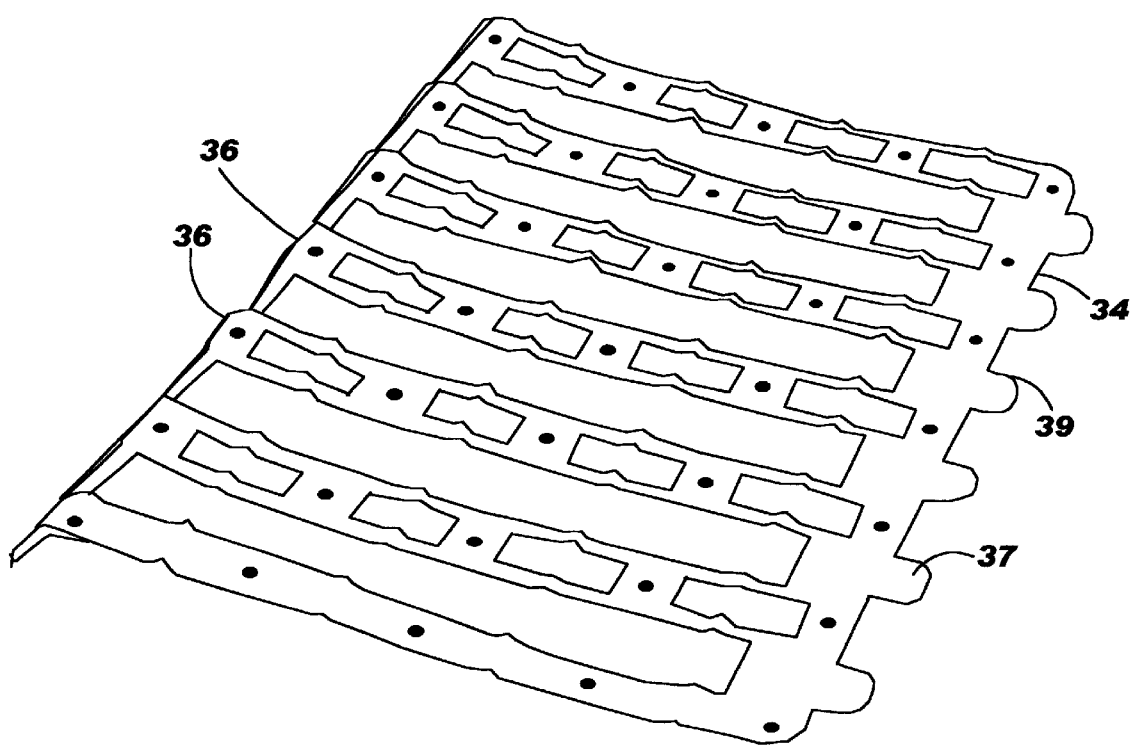
FIG. 6b is a close-up bottom view illustrating a shield in accordance with the present invention.

The shield 30 will be described in greater detail. FIG. 6a illustrates a close-up, top view of a shield 30 in accordance with the present invention. The shield 30 is preferably fabricated from a thin, electrically conductive membrane, although other suitable materials may be used. As shown in FIG. 6a, the shield 30 has a top side 32 and a bottom side 34. The shield 30 also has design features including at least one arm 36, at least one connection tab 37, a plurality of dimples 38, at least one longitudinal aperture 39, and a plurality of valleys 40. The at least one longitudinal aperture 39 may be formed to correspond to a longitudinal portions of a computer chassis 29. The plurality of dimples 38, and the plurality of valleys 40 are strategically located along the at least one arm 36 for enhanced surface area contact with adjacent surfaces such as depicted in FIG. 5, when the shield 30 is interposed between a computer chassis 28 and a circuit card mounting bracket. As shown in FIG. 6a, the plurality of dimples 38 are designed to be structurally sturdy having a spherical shape, and forming convex protrusions which extend in an upwardly direction from the surface of the shield 30. The plurality of dimples 38 are located longitudinally along ann 36. The plurality of valleys 38 also possess a sturdy design having a v-shape which protrudes in a downwardly direction from the surface of the shield 30. The plurality of valleys 40 are also located longitudinally along arm 36. In that the plurality of dimples and the plurality of valleys protrude in opposite directions away from the surface of shield 30, enhanced contact is provided forming a more effective seal when the shield 30 is placed interposed between two bodies. FIG. 6b illustrates a close-up bottom view of a shield 30 which has a bottom side 34 in accordance with the present invention.

Referring now to FIG. 5, an exploded perspective view illustrating a chassis shielding system 200 configured with a typical computer chassis in accordance with the present invention is shown. In a preferred embodiment, the shield 30 is coupled to the computer chassis 28 by at least one clip 42 in a manner which allows the at least one connection tab 37 to be received within slots 43. The at least one clip 42 is secured with a bar portion 44 so that the shield 30 remains in place. With the shield 30 coupled to the computer chassis 28, a circuit card bracket (not shown) may be mounted to the computer chassis 28 over the shield 30 so that the shield 30 is interposed between the overlapping portions of the bracket (not shown) and the computer chassis 28. The strategically located dimples 38 and valleys 40 enhance electrical contact over the length of the bracket (not shown) and the computer chassis, thereby providing effective shielding of electromagnetic and radio frequency radiation. The special design of the dimples 38 and the valleys 40 are durable, and resistant to distortions which could impair the sealing affect. The shielded chassis system in accordance with the present invention utilizes a shield which is capable of being interposed between two bodies creating an inner layer capable of flexing to absorb the gap between the two bodies, thus creating a seal.

A system in accordance with the present invention utilizes an improved shield with a low cost design which may be used to effectively shield EMI in a computer chassis. The shield has design features including dimples and valleys strategically located to provide enhanced contact and sealing capability when the shield is interposed between a first body and a second body. In a preferred embodiment, the shield is interposed between a computer chassis and a supplemental circuit card bracket to form an electro-mechanical seal in an interference condition. The system in accordance with the present invention overcomes the problems of conventional devices in providing a durable, less expensive design with enhanced sealing capability.

Although the present invention has been described in accordance with the embodiments shown, one of ordinary skill in the art will readily recognize that there could be variations to the embodiments and those variations would be within the spirit and scope of the present invention. Accordingly, many modifications may be made by one or ordinary skill in the art without departing from the spirit and scope of the appended claims.

What is claimed is:

1. A chassis shielding system comprising:
 a first body;
 a second body; and
 a shield coupled between the first body and the second body, wherein the shield includes a plurality of circular indentations and a plurality of valleys, wherein the plurality of valleys comprise folds in the shield, wherein the plurality of circular indentations contact the first body and the plurality of valleys contact the second body for providing an electromechanical seal when the shield is placed in an interference environment.

2. The chassis shielding system of claim 1 wherein the first body comprises a computer chassis.

3. The chassis shielding system of claim 1 wherein the second body comprises a circuit card bracket.

4. The chassis shielding system of claim 1 wherein the second body comprises a peripheral component interconnect ("PCI") adapter card having an attached mounting bracket for coupling the PCI adapter card to the chassis.

5. The chassis shielding system of claim 1 wherein the plurality of circular indentations and the plurality of valleys protrude in opposite directions away from the surface of the shield.

6. The chassis system of claim 1 wherein the shield has at least one arm, the arm having located thereon the plurality of circular indentations and the plurality of valleys.

7. An electromechanical shield comprising:
 an electrically conductive plate;
 a plurality of circular indentations;
 a plurality of valleys located proximately to the circular indentations, the valleys and circular indentations located on the conductive plate being capable of providing an electromechanical seal, wherein the plurality of valleys comprises folds in the electrically conductive plate, wherein the plurality of circular indentations is configured to contact a first body and the plurality of valleys is configured to contact a second body when the electromechanical shield is coupled between the first body and the second body.

8. A system of controlling electromagnetic radiation comprising:
 a chassis;
 a second body; and
 a shield coupled between the chassis and the second body, the shield having a plurality of circular indentations and a plurality of valleys located thereon, wherein the plurality of valleys comprises folds in the shield, wherein the plurality of circular indentations contacts the second body and the plurality of valleys contacts the chassis, such that an electromechanical seal is formed to reduce unwanted radiation emissions.

9. A chassis shielding system comprising:
 a computer chassis;
 a peripheral component interconnect ("PCI") adapter card, the adapter card including a mounting bracket for coupling the adapter card to the computer chassis; and
 a shield coupled between the computer chassis and the PCI adapter card, wherein the shield has at least one arm, the arm having located thereon a plurality of circular indentations and a plurality of valleys, wherein the plurality of circular indentations and the plurality of valleys protrude in opposite directions away from the surface of the shield, wherein the plurality of valleys comprises folds in the shield, wherein the plurality of circular indentations contact the mounting bracket and the plurality of valleys contact the computer chassis for providing an electromechanical seal when the shield is placed in an interference environment.

10. A chassis shielding system comprising:
 a first body;
 a second body; and
 a shield coupled between the first body and the second body, wherein the shield includes a plurality of circular indentations and a plurality of valleys protruding in opposite directions away from a surface of the shield, wherein the plurality of circular indentations contact the first body and the plurality of valleys contact the second body, wherein the contact between the plurality of circular indentations and the first body and the contact between the plurality of valleys and the second body provide an electromechanical seal when the shield is placed in an interference environment.

11. An electromechanical shield comprising:
 an electrically conductive plate;
 a plurality of circular indentations;
 a plurality of valleys located proximately to the circular indentations, wherein the plurality of circular indentations and the plurality of valleys protrude in opposite directions away from a surface of the conductive plate, wherein the plurality of circular indentations is configured to contact a first body and the plurality of valleys is configured to contact a second body when the electromechanical shield is coupled between the first body and the second body, wherein the contact between the plurality of circular indentations and the first body and the contact between the plurality of valleys and the second body provide an electromechanical seal.

12. A system of controlling electromagnetic radiation comprising:
 a chassis;
 a second body; and
 a shield coupled between the chassis and the second body, wherein the shield comprises a plurality of circular indentations and a plurality of valleys protruding in opposite directions away from a surface of the shield, wherein the plurality of circular indentations contacts the second body and the plurality of valleys contacts the chassis, wherein the contact between the plurality of circular indentations and the second body and the contact between the plurality of valleys and the chassis provide an electromechanical seal to reduce unwanted radiation emissions.

13. A chassis shielding system comprising:

a computer chassis;

a peripheral component interconnect ("PCI") adapter card, the adapter card including a mounting bracket for coupling the adapter card to the computer chassis; and a shield coupled between the computer chassis and the PCI adapter card, wherein the shield has at least one arm, the arm having located thereon a plurality of circular indentations and a plurality of valleys, wherein the plurality of circular indentations and the plurality of valleys protrude in opposite directions away from the surface of the shield, wherein the plurality of circular indentations contact the mounting bracket and the plurality of valleys contact the computer chassis, wherein the contact between the plurality of circular indentations and the mounting bracket and the contact between the plurality of valleys and the computer chassis provide an electromechanical seal when the shield is placed in an interference environment.

* * * * *